United States Patent [19]
Bude et al.

[11] Patent Number: 5,838,617
[45] Date of Patent: *Nov. 17, 1998

[54] METHOD FOR CHANGING ELECTRICALLY PROGRAMMABLE READ-ONLY MEMORY DEVICES

[75] Inventors: Jeffrey Devin Bude, New Providence; Mark Richard Pinto, Summit, both of N.J.

[73] Assignee: Lucent Technologies Inc., Murray Hill, N.J.

[ * ] Notice: The term of this patent shall not extend beyond the expiration date of Pat. No. 5,659,504.

[21] Appl. No.: 888,030

[22] Filed: Jul. 3, 1997

Related U.S. Application Data

[63] Continuation-in-part of Ser. No. 450,179, May 25, 1995, Pat. No. 5,659,504.

[51] Int. Cl.[6] .................................................. G11C 7/00
[52] U.S. Cl. ............................... 365/185.18; 365/185.19; 365/185.26
[58] Field of Search ....................... 365/185.18, 185.19, 365/185.01, 185.27, 185.26

[56] References Cited

U.S. PATENT DOCUMENTS

| | | | |
|---|---|---|---|
| 5,042,009 | 8/1991 | Kazerounian et al. | 365/185 |
| 5,222,040 | 6/1993 | Challa | 365/185 |
| 5,278,439 | 1/1994 | Ma et al. | 257/319 |
| 5,327,378 | 7/1994 | Kazerounian | 365/185 |
| 5,349,220 | 9/1994 | Hong | 257/322 |
| 5,357,476 | 10/1994 | Kuo et al. | 365/218 |
| 5,364,806 | 11/1994 | Ma | 437/43 |
| 5,381,051 | 1/1995 | Morton | 327/390 |
| 5,390,068 | 2/1995 | Schultz et al. | 361/95 |
| 5,394,365 | 2/1995 | Tsukikawa | 365/189.09 |
| 5,412,603 | 5/1995 | Schreck et al. | 365/189.01 |
| 5,487,033 | 1/1996 | Keeney et al. | 365/185.19 |
| 5,491,657 | 2/1996 | Haddad | 365/185.27 |
| 5,511,021 | 4/1996 | Bergemont et al. | 365/185.03 |
| 5,546,340 | 8/1996 | Hu et al. | 365/185.3 |

OTHER PUBLICATIONS

"Process and Device Technologies for 16Mbit EPROMs wth Large–Th Large–Tilt–Angle Implantaed P–Pocket Cell", by Ohshima, Y. et al., *IEDM Tech. Dig.*, pp. 95–98 (1990).

"Fast Programmable 256K Read Only Memory with On–Chip Test Circuits", by Atsumi, S. et al., *IEEE Solid–State Circuits*, vol. 2C–20, No. 1, pp. 422–427 (Feb. 1985).

"A Temperature and Process–Tolerant 64K EEPROM", by Bill, C. S. et al., *IEE J. Solid–State Circuits*, vol. SC–20, No. 5 pp. 979–985 (Oct. 1985).

"A 5 Volt High Density Poly–Poly Erase Flash Eprom Cell", by Kazerounia, R. et al., *IEDM Tech. Dig.*, pp. 436–439 (1988).

"A Novel Cell Structure Suitable for a 3 Volt Operation, Sector Erase Flash Memory", by Onoda, H., et al., *IEDM*, 92–599, pp. 24.3.1–24.3.4 (Apr. 1992).

"E–PROM's Integrity Starts With its Cell Structure", by Woods, M. H., *Electronics Magazine*, pp. 59–68 (Aug. 1980).

"Endurance Brightens the Future of Flash", by Robinson, K., *Electronic Component News*, pp. 167–169 (Nov. 1988).

"Nonvolatile Semiconductor Memories", Edited by Hu, C. *IEEE Electron Devices Society*, pp. 1–9.

"EEPROM/Flash Sub 3.0V Drain–Source Bias Hot Carrier Writing", by Bude, J. D., et al., *IEDM*, pp. 3.7.1–3.7.3 (95–989).

"A Fullyl Decoded 2048–Bit Electrically Programmable FAMOS Read–Only Memory", by Frohman–Bentchkowsky, D., *IEE J. Solid–State Circuits*, vol. SC–6, No. 5, pp. 301–306 (Oct. 1971).

*Primary Examiner*—Vu A. Le
*Attorney, Agent, or Firm*—Richard J. Botos

[57] ABSTRACT

A process for introducing negative charge onto the floating gate of an EPROM or EEPROM device is disclosed. The process uses CHISEL conditions to introduce charge onto the floating gate. The threshold voltage of the device is controlled by selecting a control gate voltage during programming that is less than 10 volts and that will provide a device with the desired threshold voltage. The device is then programmed using the selected control gate voltage and a negative substrate bias.

26 Claims, 3 Drawing Sheets

METHOD FOR CHANGING ELECTRICALLY PROGRAMMABLE READ-ONLY MEMORY DEVICES

CONTINUING APPLICATION DATA

This application is a continuation-in-part of application U.S. Ser. No. 08/450,179 which was filed on May 25, 1995 now U.S. Pat. No. 5,659,504 and which is incorporated by reference herein.

TECHNICAL FIELD

The invention is directed to a method for charging electrically programmable read-only memory (EPROMs and EEPROMs) devices to a desired logic state.

BACKGROUND OF THE INVENTION

A nonvolatile memory is a type of memory that retains stored data when power is removed. There are various types of nonvolatile memories, including read only memories (ROMs), erasable programmable read only memories (EPROMs), and electrically erasable programmable read only memories (EEPROMs). An EPROM is erased using ultraviolet light and an EEPROM is erased using an electrical signal. An electrical signal is used to write EPROMS and EEPROMS. In a conventional flash EEPROM ("flash" indicating all memory cells or sectors of cells can be erased at once), memory cells are simultaneously erased to a low threshold voltage and then programmed, either individually or in small groups, to a high threshold voltage. EPROMs and EEPROMs are commonly used in data processing systems that require a nonvolatile memory that is reprogrammable. For convenience, EEPROMs and EPROMs are referred to collectively herein as EPROMS.

A typical device structure for EPROMS is the floating-gate polysilicon transistor. A typical floating gate structure is illustrated in FIG. 1. As depicted in FIG. 1, a floating gate 10, sandwiched between two insulator layers 20 and 60, is between the substrate 30 and the ordinary select-gate electrode 40. The structure depicted in FIG. 1 is a stacked gate memory cell, the word stacked indicating that the floating gate 10 is stacked over the source 50 and drain 70 portions of the substrate. Another EPROM structure is a split gate structure wherein the portion of the floating gate only overlies the drain and no portion of the floating gate overlies the source. Split gate EPROM device structures are described in U.S. Pat. No. 5,349,220, to Hong which is hereby incorporated by reference. As a result, in EPROMs, the select-gate voltage must be capacitively coupled in series with the floating gate rather than directly to the underlying channel.

There are n-channel and p-channel devices with the above structures. In the n-channel devices, the source and drain are doped with an n-type dopant and the substrate is doped with a p-type dopant. In p-channel devices, the source and drain contain p-type dopant and the substrate contains n-type dopant. In silicon based substrates, such as silicon or silicon germanium (SiGe) alloys, an example of a p-type dopant is boron and examples of suitable n-type dopants are arsenic and phosphorous.

EPROMS are programmed by applying a set of bias voltages to the device dLepicted in FIG. 1. The voltage applied to the select-gate (hereinafter referred to as a control gate) is $V_C$, the voltage applied to the drain is $V_D$, and the voltage applied to the source is $V_S$. Voltage differences, typically referred to as biases, between these various terminals are designated in the following manner: e.g., $V_{CS}=V_C-V_S$ etc. In n-channel devices writing biases are used to introduce additional negative charge onto the floating gate, thereby writing the cell. However, if the charged state is chosen as the "unwritten" state, introducing additional negative charge onto the floating gate will erase the cell. Bias conditions that are used to introduce a more negatively charged state are different from bias conditions that are used to read the charged state or to create a more positively charged state.

These write biases are typically a high control gate-to-source voltage ($V_{CS}$) and/or a high drain-to-source voltage $V_{DS}$. These programming voltages are sufficient to cause a transfer of electrons from the bulk of the device (channel 80 and/or source 50 and/or drain 70) region to the floating gate 10 where they are trapped, thereby charging the floating gate more negatively. Charge is trapped in the floating gate 10 because the floating gate is isolated from the select-gate 40 by an insulating oxide layer 60 and from the drain-source-substrate region by another thin oxide insulating layer 20. The effect of trapping electrons on the floating gate is to raise the threshold voltage ($V_{TH}$) to some predetermined level. Furthermore, these programming voltages are outside of the range of normal reading bias conditions so that an inadvertent write does not occur during reading.

EPROMS typically include an array of floating-gate transistors. The $V_{TH}$ of a given cell can be determined by a sense amplifier when read and decoded into its logic value. For example, in a conventional two-state memory, a high $V_{TH}$ which has been achieved by writing as described above is decoded as a logic one, and the intrinsic $V_{TH}$ (the $V_{TH}$ of a device which has not been written by adding negative charge to the floating gate 10) is decoded as a logic zero. Because the floating gate is isolated, the cell can remain programmed or erased for periods of up to 10 years and even longer.

However, certain problems are encountered when erasing and writing memory cells in arrays of memory devices configured in a common architecture known as a NOR array. A NOR architecture consists of a plurality of EPROM devices. In a NOR architecture, at least four devices are arranged such that there is a sequence of devices in two directions. The sequence of devices in the first direction are referred to as rows of devices and the sequence of devices in the second direction are referred to as columns of devices. A NOR array requires that there be at least two rows of devices and at least two columns of devices. Furthermore, in a NOR array, each column of devices has its own dedicated bit line and the drains of the devices in a given column are connected to the same bit line. Still further each row of devices has its own word line, and the gates of the devices in a given row are all connected to the same word line. The sources are connected to a source voltage ($V_S$) supply.

Prior to the introduction of charge onto the floating gates of the cells in a NOR sub-array of memory cells, all of cells in the sub-array are erased. When a NOR array of memory cells is erased, the $V_{TH}$ distribution in the memory will be about 2 volts wide. This requires the erase to be carefully controlled to avoid "over-erasing" cells. A cell is over-erased when its $V_{TH}$ is less than zero. A cell with a $V_{TH}$ that is less than zero cannot be unselected during read. Such a cell cannot be left in this state because it adversely affects the operation of the array. All cells in the array must have a $V_{TH}$ that is sufficiently greater than zero to be unselected by application of a $V_{CS}$ equal to zero. Therefore, to the extent that cells are over-erased in a NOR array, those cells must be reprogrammed to a $V_{TH}$ greater than zero by a convergence technique. These over-erased cells cannot be written controllably using conventional channel hot electron injection techniques for introducing charge onto the floating gate because cells with a $V_{TH}$ less than zero contribute large bit-line leakage, which makes it difficult to supply the $V_{DS}$ required to write the cells. Furthermore, even if one or more of these over-erased cells are written, it is possible that unselected cells will be written in the process.

One method that is employed to introduce negative charge into the floating gate is channel hot electron injection (CHEI). The objective of CHEI is to heat electrons in the channel to high enough energies so that they enter the conduction band of the oxide layer 20, pass through it, and enter the floating gate 10. In CHEI the electron current which charges the floating gate ($I_F$) is initiated by the electron current flowing from the source to the drain ($I_{DS}$) —If $I_{DS}$ goes to zero, then IF goes to zero and, as a result, more negative charge is not introduced into the floating gate.

However, in order to introduce a charge onto the floating gate of a EPROM device by CHEI, a $V_{CS}$ typically greater than about 10 volts is required. Such a high $V_{CS}$ provides a correspondingly high $V_{TH}$. The only way to write a device to a $V_{TH}$ that is less than the value that corresponds to a high $V_{CS}$ is to monitor the charge on the floating gate during programming and cease programming when the desired $V_{TH}$ is reached. Because such monitoring is cumbersome and time-consuming, a more efficient method for programming EPROM devices to a desired $V_{TH}$ is desired.

SUMMARY OF THE INVENTION

The present invention is directed to electrically programmable memory devices such as EPROMs and EEPROMs (referred to collectively as EPROMs) herein, and a method for introducing negative charge on the floating gate using channel initiated secondary electron injection (CHISEL). The present invention is also directed to a method for programming an array of memory devices using CHISEL.

A CHISEL device is a semiconductor n-channel device formed on a substrate having a source region and a drain region therein. A first layer of dielectric material is formed on the substrate and a floating gate electrode is formed on the first layer of dielectric material. At least a portion of the floating gate electrode overlies the drain region in the substrate. A second layer of dielectric material is formed on the surface of the floating gate electrode. A control gate electrode is formed on the on the first layer of dielectric material, lying above the entire channel length from the source to the drain.

Negative charge is introduced onto the floating gate using CHISEL by applying a negative substrate-source bias voltage ($V_{BS}$) of about −0.5 volts or more negative, a control gate-source bias ($V_{CS}$) of about 10 volts or less, and a drain-source bias voltage ($V_{DS}$) of less than about 5 volts to the device. By way of definition, the voltage applied to the substrate is $V_B$. The current that charges the floating gate is initiated by the electron current from the source to the drain. In embodiments of the present invention where programming times of about 1 to about 100 $\mu$sec ($1\times10^{-6}$ seconds) are desired, VDS is about 4.5 volts or less and $V_{BS}$ is about −0.5 volts to about −4 volts.

Since the larger the $V_{DS}$, the larger the substrate leakage current, it is advantageous to use a $V_{DS}$ of less than about 3.5 volts if programming times of 10 $\mu$sec to about 100 $\mu$sec are satisfactory. Also, in order to reduce the chance that a cell in the array will be erroneously programmed when writing other cells on the same bit line, it is advantageous if $V_{BS}$ is about −0.5 volts to about −3 volts.

In the method of the present invention, because CHISEL programming is self limiting to a low $V_{TH}$ using a low $V_{CS}$, programming is accomplished by selecting a $V_{CS}$ that corresponds to a desired $V_{TH}$ and applying that $V_{CS}$ for a period of time sufficient to program the device to the desired $V_{TH}$. Thus, in the method of the present invention, a $V_{CS}$ of less than 10 volts that is associated with a desired $V_{TH}$ is selected and applied to the device during programming for a time sufficient to introduce negative charge onto the floating to provide the device with the desired $V_{TH}$. Consequently, the method of the present invention permits a device to be programmed by selecting a $V_{CS}$ that corresponds to a desired $V_{TH}$. It is contemplated that it will not be necessary to monitor $V_{TH}$ during programming because, under the selected programming conditions, the actual $V_{TH}$ does not increase significantly over the desired $V_{TH}$ over time. In effect, the device quits programming (i.e. the negative charge on the floating gate does not increase significantly over time) once the desired $V_{TH}$ is reached. It is advantageous to use the CHISEL programming method of the present invention to program flash EPROM devices in a NOR architecture. However, statistical variations between devices dictates that a set of devices programmed with $V_{CS}$ will have a spread of $V_{TH}$ around the desired value. In certain embodiments, the devices are monitored in order to achieve the desired accuracy for $V_{TH}$ in all devices. In the context of the present invention, $V_{CS}$ is selected either by applying a predetermined $V_{CS}$ or by measuring $V_{TH}$ during programming and selecting a $V_{CS}$ in response to that measurement.

The $V_{TH}$ of a device is the voltage that must be applied in order for drain current ($I_D$) to flow from the device. In the operation of memory devices, when a detectable $I_D$ flows from the device, the device reads as on. Consequently, when $I_D$ is not detectable, the device reads as off. One skilled in the art will appreciate that the amount of drain current needed for the device to register as on will depend upon the sensitivity of the sense amplifier being used to detect $I_D$.

In an array of devices with multi-logic states, as the name implies, there are more than two logic levels. Each level is associated with a particular threshold read voltage ($V_{TH-RD-0}$, $V_{TH-RD-1}$, $V_{TH-RD-2}$, ... $V_{TH-RD-n}$) where $V_{TH-RD-n}$ is less than $V_{TH-RD-0}$, $V_{TH-RD-n+1}$ where n is a non-negative integer. The notation $V_{TH-RD}$ is used to define a threshold which depends on the current level required by the sense-amplifier being used. It is related to, but different from the standard device $V_{TH}$. For example, devices programmed to have a threshold voltage $V_{TH-RD-0}$ read as "on" when a control gate voltage at or above $V_{TH-RD-0}$ is applied to the device. Devices programmed to have a threshold voltage at $V_{TH-RD-n}$ read as "on" when a control gate voltage at or above $V_{TH-RD-n}$ is applied to the device but read as "off" when a $V_{CS}$ below $V_{TH-RD-n}$ is applied to the device, etc. According to the method of the present invention, it is possible to select a $V_{CS}$ of less than about 5 volts to program to both $V_{TH-RD-0}$ or $V_{TH-RD-1}$ provided that $V_{TH-RD-1}$ is suffciently greater than $V_{TH-RD-0}$).

In a binary device, i.e. a device with two logic states, the on state is a first logic state (e.g. logic zero) and the off state is a second logic state (e.g., logic one). Devices programmed to have a zero-state $V_{TH-RD}$ below the read voltage, $V_{RD}$, read as on when a control gate voltage, $V_{CS}$, at or above the $V_{RD}$ is applied to the device. Devices programmed to have a first order $V_{TH-RD}$ above the read voltage, $V_{RD}$, read as off when the $V_{RD}$ is applied to the device.

In the method of the present invention, the devices (or a collection of devices in a sub-array desired to be subsequently written) are erased by applying a fixed erase pulse in which either $V_{CS}$, $V_{CD}$, or $V_{CB}$ are sufficiently negative to cause tunnel erasure of the floating gate until the threshold voltage of all of the devices in the array are less than the zero order threshold voltage of the device ($V_{TH\text{-}RD\text{-}0}$). The memory cells are then programmed using the following conditions: a negative substrate-source bias voltage ($V_{BS}$) of about –0.5 volts to about –4 volts, a control gate-source bias ($V_{CS}$) of about 10 volts or less that is selected to provide the device with a desired threshold voltage, $V_{TH\text{-}RD\text{-}n}$, and a drain-source bias voltage ($V_{DS}$) of less than about 4.5 volts. Typically, at least one of the cells in the array will be programmed to a logic state higher than $V_{TH\text{-}RD\text{-}0}$. The $V_{CS}$ selected to program selected cells to a higher order (n) logic state is, at a minimum, at least 0.1 volt higher than the $V_{CS}$ used to program to the next lower logic level $V_{TH\text{-}RD\text{-}(n-1)}$. It is advantageous if the $V_{CS}$ that provides $V_{TH\text{-}RD\text{-}n}$ is at least 0.25 volts higher than the $V_{CS}$ that provides $V_{TH\text{-}RD\text{-}(n-1)}$. Since the present invention contemplates both positive and negative voltages, higher (lower) means either more (less) positive or more (less) negative. In certain embodiments it will be advantageous if the $V_{CS}$ that provides $V_{TH\text{-}RD\text{-}n}$ is at least 1 volt greater than the $V_{CS}$ that provides $V_{TH\text{-}RD\text{-}(n-1)}$.

Such variety and flexibility in selecting $V_{TH\text{-}RD}$ is not afforded by prior art methods for programming EPROM devices. For example, in CHEI, $V_{CS}$ must be high (e.g. 10 volts) to program the device. Because $V_{CS}$ is required to be so high, $V_{TH\text{-}RD}$ increases rapidly as a function of time through a wide range of lower $V_{TH}$ (e.g., voltages in the 1 to 5 volt range) before beginning to level off. Thus, the only way to program an EPROM device to a low $V_{TH\text{-}RD}$ (e.g. threshold voltages in the range of about 1 volt to about 5 volts) is to monitor the $V_{TH}$ of the device during programming and to interrupt programming when the desired $V_{TH\text{-}RD}$ is reached. Because $V_{TH}$ is increasing rapidly as a function of time, it is difficult to program an EPROM device to a low $V_{TH\text{-}RD}$ using CHEI. Also, the natural over-erase protection afforded through CHISEL to write the zero-state permits programming a lower zero-state $V_{TH\text{-}RD}$ than in CHEI. In CHISEL devices, $V_{TH\text{-}RD\text{-}0}$ is as low as 0.4 volts and $V_{CS}$ is as low as 1.5 volts. In CHEI, the zero order $V_{TH\text{-}RD}$ state is typically higher than the highest $V_{TH\text{-}RD}$ of the devices in the array after erasure. The higher zero-order $V_{TH\text{-}RD}$ is required for CHEI devices in order to avoid over-erasure, which requires that the lowest erased $V_{TH\text{-}RD}$ be greater than zero. Since the distribution of erased $V_{TH}$'S in an array of CHEI devices is about 2 volts wide, the $V_{TH\text{-}RD\text{-}0}$ is about 2 volts and, typically, CHEI devices have a $V_{TH\text{-}RD\text{-}0}$ that is greater than 2 volts.

DETAILED DESCRIPTION

Figure 1:
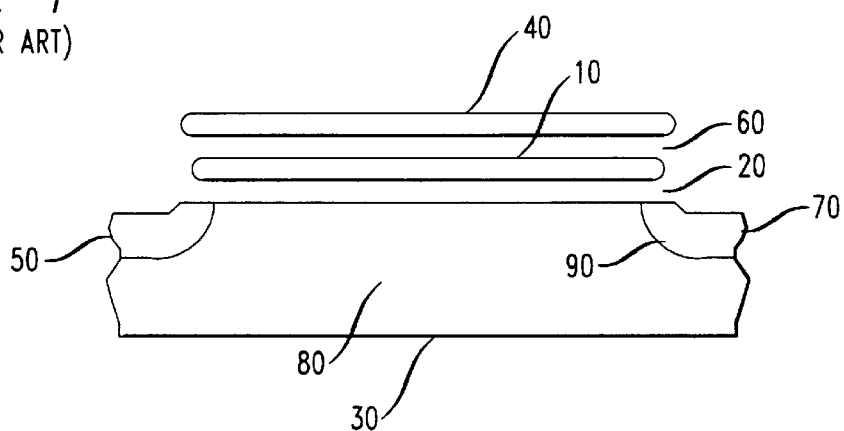
FIG. 1 illustrates a floating gate memory device.

The present invention is directed to a process for programming floating gate memory devices, specifically EPROM devices. The devices are programmed using CHISEL. The method of the present invention utilizes the self-limiting aspect of CHISEL to introduce charge onto the floating gate in a more efficient manner than in prior art methods for introducing charge onto the floating gate.

As previously noted, certain conditions are required to introduce negative charge onto a floating gate (introduction of a negative charge onto a floating gate is referred to as writing the floating gate or programming the floating gate herein) of an EPROM device using CHISEL. In the method of the present invention, a $V_{CS}$ in the range of about 1.5 volts to less than about 10 volts that corresponds to the desired threshold voltage of the device is selected to program the device. As previously noted, in an array of devices, typically some of the devices are programmed to correspond to a first logic level and some of the devices are going to be programmed to at least a second logic level. One skilled in the art will appreciate that the number of logic levels can exceed two.

Programming cells in a NOR array requires raising the voltage of a selected word-line to the desired $V_{CS}$ and applying a $V_{DS}$ (1.1 volts<$V_{DS}$<5 volts) to the bit lines of the cells being programmed. The word lines of unselected cells and unselected bits have $V_{CS}=0$ and $V_{DS}=0$, respectively. Typically, one word line in an array is selected at a time during programming (i.e. when data is being written). However, in some embodiments when the zero state $V_{TH\text{-}RD}$ is being programmed, several, but less than all, word lines in the array (typically less than 10) are selected simultaneously during programming. The number of selected word lines is kept low in order to keep the programming current through a given bit line low.

In the method of the present invention, the devices in an array are erased prior to programming using the following conditions: either $V_{CS}$, $V_{CD}$, or $V_{CB}$ is less than zero (e.g., $V_{CB}$ is approximately equal to –17 volts to erase the devices in less than one second). Then, in the embodiment of the invention wherein the EPROM devices are stacked gate devices, all of the devices in the array are programmed to a desired logic level by introducing sufficient negative charge onto the floating gate that corresponds to the zero order threshold voltage. In the embodiment of the present invention wherein the EPROM devices are not stacked gate devices, the devices are erased to $V_{TH\text{-}RD\text{-}0}$. Only those non-stacked gate devices that are desired to be programmed to a logic state higher than $V_{TH\text{-}RD\text{-}0}$ are subsequently written.

The zero order threshold voltage is at least about 0.4 volts but is less than the first order threshold voltage (and higher order threshold voltages, if any). All threshold voltages are less than 10 volts. An nth order threshold voltage is less than an n+1 threshold voltage.

The device or devices are programmed by applying a $V_{CS}$ to the device that is less than 10 volts but greater than zero volts. The $V_{BS}$ is about –0.5 volts or more negative. The $V_{DS}$ is less than about 5 volts. $V_{CS}$ is selected to provide the devices with a desired threshold voltage $V_{TH\text{-}RD\text{-}n}$, wherein n is zero or a positive integer.

In the context of programming by CHISEL, a $V_{CS}$ that will program a device to a desired $V_{TH\text{-}RD\text{-}n}$ is readily determined because there is a linear relationship between the required $V_{CS}$ and the combined value of $V_{TH\text{-}RD\text{-}n}$ and a constant related to the body effect shift due to the negative $V_{BS}$ used to write the device. One skilled in the art will appreciate that the body effect is the relationship between the substrate bias and the threshold voltage of the device. In most cases, the body effect of the device requires that $V_{CS}$ be higher than $V_{TH\text{-}RD\text{-}n}$. How much higher will depend upon the body effect for a particular device, the $V_{BS}$ applied to the device during programming, and the $I_{DS}$ required to read a cell as on which is readily determined by one skilled in the art. For the devices and programming conditions of the present invention, a body effect of about 1 volt to about 2 volts is expected. The body effect is advantageous because it effectively precludes the possibility that stacked-gate devices in a NOR array will be over-erased. This is because the threshold voltage of the device is shifted upward by the value of the body effect. Thus, the problems associated with over-erasure of devices programmed by CHEI are not present in devices programmed by CHISEL. This allows $V_{TH\text{-}RD\text{-}0}$ to be set lower than in prior art stacked gate devices in a NOR array as noted previously.

Once a $V_{CS}$ is selected for a desired $V_{TH\text{-}RD\text{-}n}$, the device is programmed by the application of that $V_{CS}$ to the device. Programming is a dynamic process, i.e., over time, the threshold voltage of the device during programming ($V_{TH\text{-}PROG}$) increases until the desired threshold voltage $V_{TH\text{-}RD\text{-}n}$ is reached. In order to continue to introduce charge onto the floating gate, $V_{CS}$ at any given time (t) must be greater than $V_{TH\text{-}PROG}(t)$. Following from the prescribed relationship between $V_{CS}$ and $V_{TH\text{-}PROG}(t)$ is the ability to change the $V_{CS}$ during programming. This is advantageous because it provides the ability to reduce the drain current, $I_D$, during programming.

Specifically, $I_D$ is proportional to the square of the difference between $V_{CS}$ and $V_{PROG}(t)$ and a constant related to the body coefficient. Therefore, if the difference between $V_{CS}$ and $V_{PROG}(t)$ is controlled during programming by beginning with a $V_{CS}$ less than that desired, and increasing it to the desired value during programming instead of using one value for $V_{CS}$ during the programming cycle, $I_D$ is reduced during the programming cycle. Because CHISEL is more efficient when $V_{CS}-V_{TH\text{-}PROG}$ is small, $I_D$ can be decreased in this manner without much effect on programming time. Efficient programming in this manner can be achieved in less than 10 $\mu$sec using $V_{DS}=3.5$ volts, $V_{BS}=-3$ volts and with an $I_D$ of less than 20 $\mu$A. Programming in this manner requires that $V_{CS}(t)$ be maintained larger than $V_{PROG}(t)$ in order to introduce charge onto the floating gate. However, $V_{CS}(t)$ must also be less than or equal to the $V_{CS}$ associated with the desired logic level, $V_{TH\text{-}RD\text{-}n}$, being written in order to avoid programming a device to a different threshold voltage (e.g. $V_{TH\text{-}RD\text{-}(n+1)}$) that is different than the desired $V_{TH\text{-}RD\text{-}n}$. In one embodiment of the present invention, $V_{CS}(t)$ is a stepped function in which $V_{CS}$ is incremented through discrete levels.

There are numerous advantages to controlling $I_D$ during programming. Specifically, if $I_D$ is smaller during programming, it is easier to charge-pump the drain voltage from a lower power supply voltage and get the desired $V_{DS}$. Furthermore, since programming power is proportional to $I_D$, programming power is reduced by reducing $I_D$. Also, series resistance loss from contact and bit lines is reduced by reducing $I_D$ for the devices during programming. However, this constraint does not mandate that $V_{CS}$ be varied throughout the programming cycle.

Figure 2:
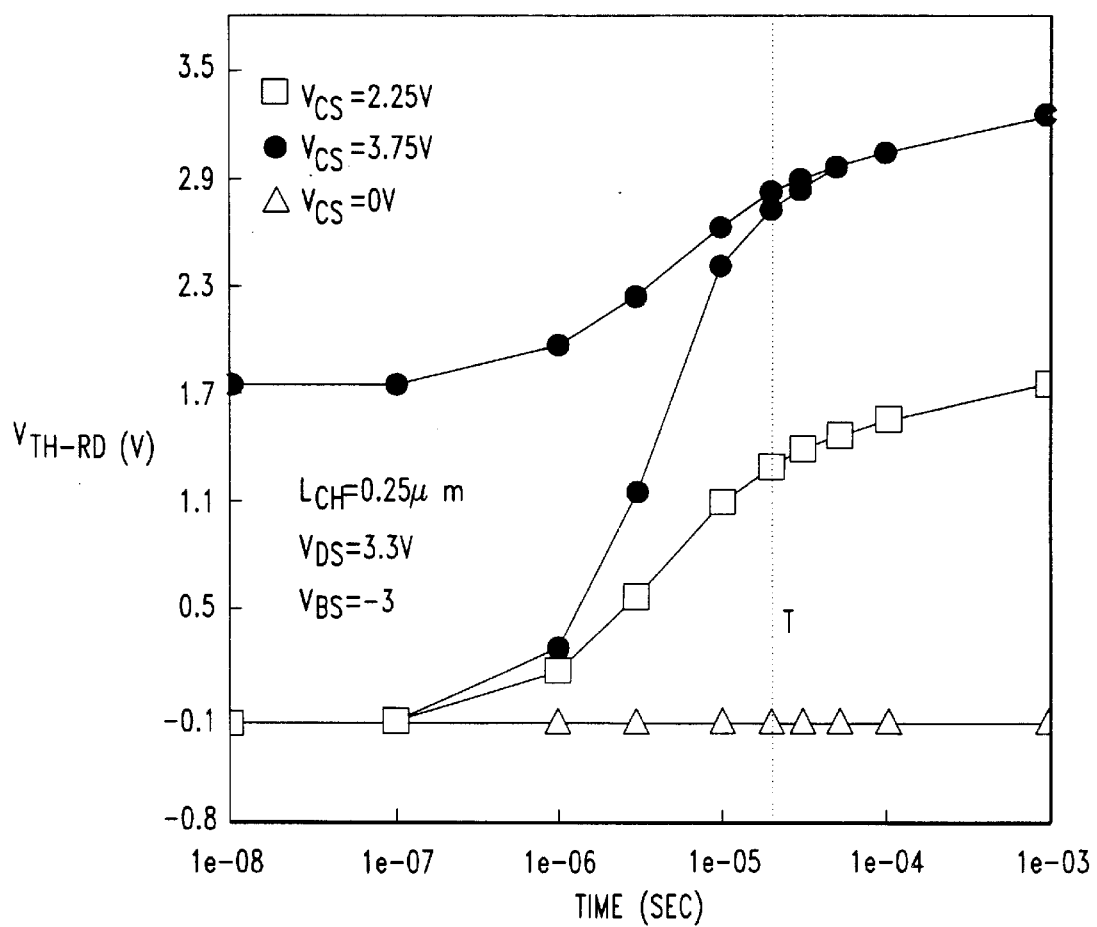
FIG. 2 is a graph of the change in threshold voltage as a function of time for CHISEL devices at various $V_{CS}$.

As previously noted, programming the floating gate using the CHISEL mechanism is self-limiting during programming with a $V_{CS}$ of less than about 10 volts. In the context of the present invention, self-limiting means that, after a certain time at a certain $V_{CS}$, the threshold voltage of a device does not increase significantly. For example, when $V_{CS\text{-}0}$ is applied to the device, once the $V_{TH}$ of the device reaches $V_{TH\text{-}0}$, the threshold voltage of the device does not continue to increase significantly. FIG. 2 is a graph of the change in threshold voltage as a function of time for CHISEL devices at $V_{CS}$ of 2.25 volts, 3.75 volts, and zero volts. FIG. 2 illustrates that devices program to a particular threshold voltage for a given $V_{CS}$, and, once that threshold voltage is reached, the threshold voltage does not increase significantly even if programming continues. The increase of $V_{TH\text{-}RD}$ as a function of time was measured for an EPROM device with a channel length of 0.25 $\mu$m, a $V_{DS}$ of 3.3 volts and a $V_{BS}$ of $-3$ volts.

The dashed line in FIG. 2 illustrates the observed increase in $V_{TH\text{-}RD}$ as a function of time. The $V_{TH\text{-}RD}$ increased from $-0.1$ to about 1.1 V at time T ($2\times10^{-5}$ sec) when a $V_{CS}$ of 2.25 volts was applied to the device. The self-limiting aspect of the method of the present invention is illustrated by the fact that, after time T, $V_{TH\text{-}RD}$ no longer increases significantly. The programming current of the devices programmed under the conditions described in FIG. 2 had a measured maximum of 100 $\mu$A/$\mu$m and an average of about 60 $\mu$A/$\mu$m. When programming devices using CHEI, a programming current of about 1 mA/$\mu$m is typically required. The body-effect aspect of CHISEL programming is illustrated by the fact that the cell does not program when $V_{CS}$ is zero, even though $V_{TH}$ was less than zero. Also essentially no cell current (i.e. current less than about 100 pA/$\mu$m) is generated when $V_{CS}$ is less than zero. This is because the actual $V_{TH\text{-}RD}$ of the device at time zero was $-0.1$ volts plus the body effect, which, for the device described in FIG. 2, was about 1 volt. Furthermore, the $V_{TH\text{-}RD\text{-}0}$ of the CHISEL device was 1.1 volt, yet the cell was not overerased The fact that a particular $V_{CS}$ provides the device with a particular $V_{TH\text{-}RD}$ is also demonstrated by FIG. 2. Both lines with circles illustrate the $V_{TH\text{-}RD}$ of devices that were programmed at a $V_{CS}$ of 3.75 volts. One device had a $V_{TH\text{-}RD}$ of $-0.1$ volts at time $t_0$ and one device had a $V_{TH\text{-}RD}$ of 1.8 volts at time $t_0$. FIG. 2 demonstrates that both devices programmed to the same $V_{TH\text{-}RD}$ at time T. This indicates that $V_{TH\text{-}RD}$ is a function of the $V_{CS}$ applied to the device during programming independently of the initial state before programming.

In conventional methods for introducing a charge onto the floating gate, the programming cycle must be monitored to determine when sufficient negative charge has been introduced onto the floating gate to provide the device with the desired $V_{TH}$. Monitoring is required because the negative charge introduced onto the floating gate is a function of time and the threshold voltage to which the device has been erased. One skilled in the art is aware that a block of FLASH memory devices are erased before the devices are programmed to their desired logic states and that there is some variation in the threshold voltage of the erased devices. Furthermore, in prior art methods for programming a memory device (i.e. CHEI as previously described), a $V_{CS}$ of at least 10 volts is required to introduce negative charge onto the floating gate. Under such conditions, the only way to control the $V_{TH}$ of a particular device is to monitor the device periodically during programming to determine its $V_{TH}$. When the measured $V_{TH}$ is equal to the desired $V_{TH}$, programming is complete.

Figure 3:
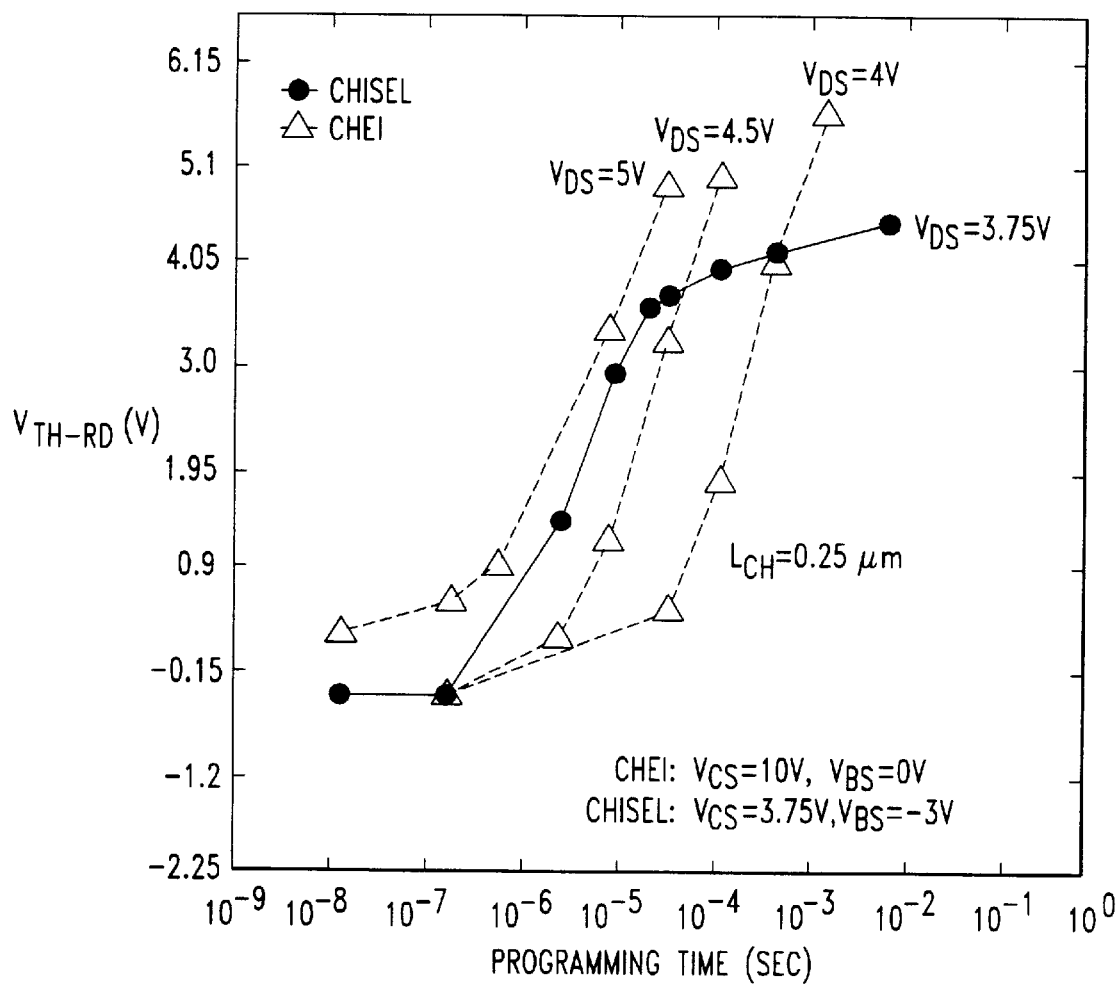
FIG. 3 illustrates threshold voltage of a device programmed using CHEI as a function of time compared to CHISEL.

FIG. 3 illustrates threshold voltages of devices programmed using CHEI as a function of time. $V_{CS}$ is 10 volts for the CHEI programming cycles illustrated in FIG. 3. These programming cycles were measured by programming devices using a $V_{BS}$ of 0 volts. The channel length of all the devices described in FIG. 3 was 0.25 $\mu$m. As illustrated by the dashed lines in FIG. 3, for $V_{DS}$ of 4 volts, 4.5 volts, and 5 volts, the $V_{TH\text{-}RD}$ of the CHEI devices continued to significantly increase above 2.5 volts. In order to program using CHEI, a large $V_{CS}$ (e.g. 10 volts) is required. FIG. 3 illustrates that the threshold voltages of the devices programmed by CHEI continue to increase as a function of time. The solid line in FIG. 3 illustrates the threshold voltage as a function of time of a device being programmed by CHISEL. The device was programmed by applying a $V_{CS}$ of 2.5 volts and a $V_{BS}$ of −3 volts to the device. The solid line demonstrates that the threshold voltage of a device programmed by CHISEL did not increase significantly above 2.5 volts. Furthermore, the CHISEL-programmed device reached this threshold voltage in about $4 \times 10^{-6}$ seconds when a $V_{DS}$ of 3.75 volts was applied to the device. A $V_{DS}$ of 5 volts and a $V_{CS}$ of 10 volts was required to program the device to 2 volts in a comparable time using CHEI.

Figure 4:
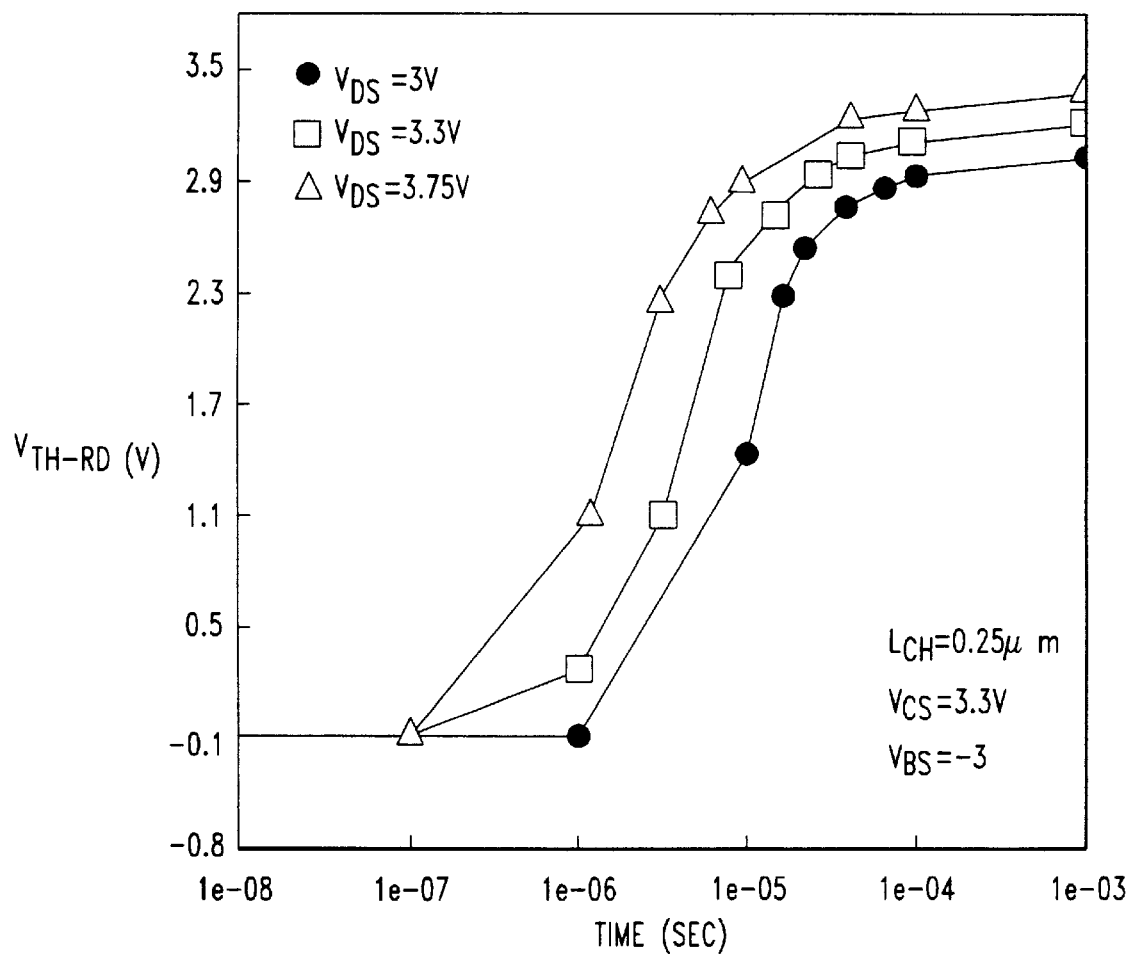
FIG. 4 illustrates the relationship between $V_{DS}$ and programming time in the process of the present invention.

The present invention is also directed to a method for programming flash EPROM devices in times less than 100 μsec. Programming times of less than 100 μsec, even as low as 10 μsec, are required to write large memories (1 Mbit or larger) in a reasonable amount of time. FIG. 4 illustrates the relationship between $V_{DS}$ and programming time in the method of the present invention. FIG. 4 also illustrates that, in order to obtain programming time of less than 10 μsec with a $V_{BS}$ of −3 volts, a $V_{DS}$ of at least about 3.75 volts is required. Programming with the CHISEL process of the present invention at $V_{DS}$ of 3.75 volts and a VBs of −3 volts is more than one-hundred times faster than programming with a non-CHISEL process ($V_{BS}$=0 volts) at $V_{DS}$ of 3.75 volts.

Although faster programming times are achieved with higher $V_{DS}$, $V_{DS}$ is limited by the fact that substrate leakage increases with increasing $V_{DS}$. Band to band tunneling leakage currents from the drain-substrate junction increase exponentially with $V_{DS}$. These leakage currents become difficult to support in large memory arrays. For example, in order to achieve the negative $V_{BS}$ required for CHISEL programming the substrate is charge-pumped. Charge-pumping the substrate is made more difficult with increased substrate leakage current. Furthermore, since increased drain-tub leakage currents also increase the bit-line series resistance drop, the larger the leakage current is, the larger the required bit-line voltage will have to be to achieve the desired $V_{DS}$. Also, an increase in $V_{DS}$ also increases the substrate leakage current from impact ionizing channel electrons. As the channel-initiated current increases, so does the oxide damage from hot electrons and hot holes. This substrate leakage current is large enough when programming with CHEI to damage the oxide. In CHISEL, a $V_{DS}$ of less than about 4 volts provides sufficiently low drain-substrate leakage (<about 10 nA/cell) to avoid the problems described above.

In CHISEL, $V_{DS}$ is limited to less than 5 volts because of disturbs. A disturb is the erroneous programming of a partially selected cell (high bit-line drain voltage by low word line gate voltage) in a memory array. With increasing VDS, the drain-substrate leakage current that injects holes in the substrate, thereby generating secondary electrons, also increases. When $V_{BS}$ is less than zero as in CHISEL programming, a leakage-initiated parasitic ionization feedback results that has the potential to program the partially selected cell. The larger the $V_{DS}$ is, the larger the disturb effect is. Therefore, the larger the $V_{DS}$ is, the smaller the difference is between the time it takes a fully selected cell to program and the time it takes a partially selected cell to program. The desired difference (the time it takes a partially selected cell to program is advantageously on the order of $1 \times 10^5$ larger than the time it takes to program a fully selected cell) is obtained when $V_{BS}$ is less negative than about −4 volts and $V_{DS}$ is less than about 5 volts.

In order for a cell to be effectively programmed by CHISEL it is advantageous if $V_{BS}$ is in the range of about −5 volts to about −4 volts. In order to provide an advantageous margin between the programming time and the disturb time, it is advantageous if $V_{BS}$ is about −0.5 volts to about −3 volts.

After the devices have been programmed to the desired logic state, the information stored in the memory can be accessed by addressing one or more devices. A device is addressed by applying certain reading biases. In a binary array the device reads as "on" if the threshold voltage of the device is below the read $V_{CS}$ and "off" if its threshold voltage is above the read $V_{CS}$. In a binary array, an on device is a logic zero and an off device is a logic one. In a multi-state memory, the state is read by comparing read $I_{DS}$ at different levels of $V_{CS}$.

CHISEL devices are programmed or written under certain prescribed conditions which require a negative substrate bias. However, when these devices are read, it is advantageous if the substrate bias applied to the devices is zero. When the substrate bias is zero during read, a "read disturb" is less likely. A read disturb is a condition whereby the charge on the floating gate of a device in the array is changed when that device or another device in the array is read. It is advantageous if the device is read under the following conditions: $0 < V_{CS} < 5$ V; $V_{BS} = 0$ V; and $V_{DS} < 1.2$ V.

One advantage of the present invention is that $V_{CS}$ is selected to provide a desired threshold voltage. In the embodiment of the present invention wherein the cell is a stacked gate cell in a NOR array, one example of a desired $V_{TH\text{-}RD\text{-}0}$ is about 3 volts. In this embodiment, the device programmed to a $V_{TH\text{-}RD\text{-}0}$ of about 3 volts is read using a $V_{CS}$ of about 3 volts (and the other read conditions prescribed above). Another example of a desired $V_{TH\text{-}RD\text{-}0}$ for such stacked gate cells is about 1.8 volts. In this embodiment, the device programmed to a $V_{TH\text{-}RD\text{-}0}$ of about 1.8 volts is read using a $V_{CS}$ of about 1.8 volts (and the other read conditions prescribed above). The examples used to illustrate the invention are not intended by way of limitation, except within the spirit and scope of the appended claims.

What is claimed is:

1. A method for charging a floating gate of an n-channel memory cell having a source, drain, control gate, floating gate, and a substrate comprising:

applying a voltage to the drain terminal of the cell to affect a positive bias of less than about 4.5 volts between the drain and the source ($V_{DS}$);

applying a voltage to the control gate terminal of the cell to affect a positive bias of about 10 volts or less between the control gate and the source ($V_{CS}$) wherein the control gate voltage is selected to provide the device with a desired threshold voltage and;

applying a negative voltage to the substrate to effect a negative bias of about −0.5 volts to about −4 volts between the substrate and the source ($V_{BS}$) wherein the current that charges the floating gate is initiated by the electron current from the source to the drain.

2. The method of claim 1 wherein $V_{DS}$ is selected to program the device in about 100 μsec or less.

3. The method of claim 1 wherein $V_{DS}$ is less than about 4 volts and is selected to program the device in about 10 μsec or less.

4. The method of claim 1 wherein $V_{DS}$ is selected to program the device in about 1 μsecond.

5. The method of claim 2 wherein $V_{DS}$ is less than about 3.5 volts.

6. The method of claim 5 wherein the $V_{BS}$ is about −0.5 volts to about −3 volts.

7. The method of claim 1 wherein the charged cell is read by:
applying a voltage to the control gate terminal of the cell to effect a positive bias of greater than about zero volts but less than about 5 volts;
applying a voltage to the drain terminal of the cell to affect a positive bias of less than about 1.2 volts between the drain and the source; and
maintaining about a zero voltage bias between the substrate and the source.

8. The method of claim 1 wherein $V_{CS}$ is increased when charging the floating gate and wherein at all times (t) during charging $V_{CS}(t)$ is greater than $V_{TH}(t)$.

9. The method of claim 1 wherein a plurality of cells in an array of cells are programmed to a first logic state, $V_{TH\text{-}RD\text{-}0}$ and a second logic state, $V_{TH\text{-}RD\text{-}1}$, and wherein the $V_{CS}$ used to program the cells to $V_{TH\text{-}RD\text{-}0}$ is less than about 5 volts and the $V_{CS}$ used to program the cells to $V_{TH\text{-}RD\text{-}1}$ is less than about 5 volts.

10. The method of claim 9 wherein the n-channel memory cell is a stacked-gate memory cell in a NOR array and wherein the $V_{CS}$ used to program the cells to $V_{TH\text{-}RD\text{-}0}$ is selected to provide a $V_{TH\text{-}RD\text{-}0}$ that is less than or equal to about 3 volts.

11. The method of claim 10 wherein the $V_{CS}$ used to program the cells to $V_{TH\text{-}RD\text{-}0}$ is selected to provide a $V_{TH\text{-}RD\text{-}0}$ that is less than or equal to about 1.8 volts.

12. The method of claim 10 wherein the charged cell is read by:
applying a voltage to the control gate terminal of the cell to affect a positive bias of about 3 volts;
applying a voltage to the drain terminal of the cell to effect a positive bias of less than about 1.2 volts between the drain and the source; and
maintaining about a zero voltage bias between the substrate and the source.

13. The method of claim 11 wherein the charged cell is read by:
applying a voltage to the control gate terminal of the cell to effect a positive bias of about 1.8 volts;
applying a voltage to the drain terminal of the cell to effect a positive bias of less than about 1.2 volts between the drain and the source; and
maintaining about a zero voltage bias between the substrate and the source.

14. The method of claim 1 wherein the selected $V_{CS}$ is predetermined.

15. The method of claim 1 wherein $V_{CS}$ is selected by reading the cell and selecting a $V_{CS}$ that will provide the desired threshold voltage.

16. A method for charging a floating gate of an n-channel memory cell having a source, drain, control gate, floating gate, and a substrate comprising:
applying a voltage to the drain terminal of the cell to effect a positive bias of less than about 4.5 volts between the drain and the source ($V_{DS}$);
applying a voltage to the control gate terminal of the cell to effect a positive bias of about 10 volts or less between the control gate and the source ($V_{CS}$) and;
applying a negative voltage to the substrate to effect a negative bias of about −0.5 volts to about −4 volts between the substrate and the source ($V_{BS}$) wherein the current that charges the floating gate is initiated by the electron current from the source to the drain.

17. The method of claim 16 wherein $V_{DS}$ is selected to program the device in about 100 μsec or less.

18. The method of claim 16 wherein $V_{DS}$ is less than about 4 volts and is selected to program the device in about 10 μsec or less.

19. The method of claim 16 wherein $V_{DS}$ is selected to program the device in about 1 μsecond.

20. The method of claim 17 wherein $V_{DS}$ is less than about 3.5 volts.

21. The method of claim 20 wherein the $V_{BS}$ is about −0.5 volts to about −3 volts.

22. The method of claim 16 wherein the control gate voltage is selected to provide the device with a desired threshold voltage.

23. The method of claim 22 wherein $V_{CS}$ is increased when charging the floating gate and wherein at all times (t) during programming $V_{CS(t)}$ is greater than $V_{TH(t)}$.

24. The method of claim 23 wherein a plurality of cells in an array of cells are programmed to a first logic state, $V_{TH\text{-}RD\text{-}0}$ and a second logic state, $V_{TH\text{-}RD\text{-}1}$, and wherein the $V_{CS}$ used to program the cells to $V_{TH\text{-}RD\text{-}0}$ is less than about 5 volts and the $V_{CS}$ used to program the cells to $V_{TH\text{-}RD\text{-}1}$ is less than about 5 volts.

25. The method of claim 1 wherein the n-channel memory cell is a stacked gate memory cell.

26. The method of claim 25 wherein the stacked gate memory cell is in a NOR array.

* * * * *